(12) United States Patent
Tsau

(10) Patent No.: US 12,046,657 B2
(45) Date of Patent: Jul. 23, 2024

(54) METHOD OF MANUFACTURING A SEMICONDUCTOR DEVICE INCLUDING CAPPING LAYER, BARRIER LAYER AND WORK FUNCTION LAYER

(71) Applicant: TAIWAN SEMICONDUCTOR MANUFACTURING COMPANY, LTD., Hsinchu (TW)

(72) Inventor: Hsueh Wen Tsau, Zhunan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 171 days.

(21) Appl. No.: 17/076,068

(22) Filed: Oct. 21, 2020

(65) Prior Publication Data

US 2021/0036123 A1    Feb. 4, 2021

Related U.S. Application Data

(60) Division of application No. 15/693,874, filed on Sep. 1, 2017, now Pat. No. 10,818,767, which is a
(Continued)

(51) Int. Cl.
  *H01L 21/8238* (2006.01)
  *H01L 21/28* (2006.01)
  (Continued)

(52) U.S. Cl.
  CPC .... *H01L 29/4983* (2013.01); *H01L 21/28088* (2013.01); *H01L 21/76846* (2013.01);
  (Continued)

(58) Field of Classification Search
  CPC ........... H01L 29/4966; H01L 29/66545; H01L 21/28088; H01L 21/823842;
  (Continued)

(56) References Cited

U.S. PATENT DOCUMENTS 6,921,711 B2    7/2005  Cabral et al.
2006/0065939 A1* 3/2006  Doczy ............ H01L 21/823437
                                                            438/585
(Continued)

FOREIGN PATENT DOCUMENTS

CN          1846313      10/2006
CN        102103994       6/2011

OTHER PUBLICATIONS

Office Action dated Oct. 11, 2019 from corresponding application No. CN 201711175278.2.

Primary Examiner — David Chen
(74) Attorney, Agent, or Firm — Hauptman Ham, LLP

(57) ABSTRACT

A method of making a semiconductor device includes forming first and second dummy gates over a substrate. The method includes removing the first and second dummy gates to define first and second openings. The method includes depositing a continuous gate dielectric layer in the first opening and the second opening. The method includes depositing a continuous capping layer on the gate dielectric layer, wherein the capping layer includes TaC. The method further includes depositing a continuous barrier layer on the capping layer, wherein the barrier layer includes TaC and a second material. The method includes depositing a first work function layer over the barrier layer in the first opening. The method includes depositing a second work function layer over the barrier layer in the second opening. The method includes depositing a continuous metal layer over each of the first work function layer and the second work function layer.

20 Claims, 11 Drawing Sheets

Related U.S. Application Data continuation of application No. 13/192,718, filed on Jul. 28, 2011, now Pat. No. 9,755,039.

(51) Int. Cl.
*H01L 21/768* (2006.01)
*H01L 29/49* (2006.01)
*H01L 29/66* (2006.01)
*H01L 29/78* (2006.01)
*H01L 29/51* (2006.01)

(52) U.S. Cl.
CPC .. *H01L 21/823842* (2013.01); *H01L 29/4966* (2013.01); *H01L 29/66545* (2013.01); *H01L 29/7833* (2013.01); *H01L 29/517* (2013.01)

(58) Field of Classification Search
CPC ......... H01L 21/76846; H01L 29/66583; H01L 29/4983; H01L 29/7833; H01L 29/517
USPC ........ 438/229, 275, 592, 785; 257/288, 369, 257/751, E21.19, E21.204, E29.16, 257/E29.255
See application file for complete search history.

(56) References Cited

U.S. PATENT DOCUMENTS

| | | |
|---|---|---|
| 2009/0181504 A1 | 7/2009 | Lin |
| 2010/0087056 A1* | 4/2010 | Chung .............. H01L 21/28088 438/585 |
| 2010/0328022 A1* | 12/2010 | Fan .......................... H01L 28/20 257/E21.409 |
| 2011/0006354 A1* | 1/2011 | Jangjian ............ H01L 29/66583 257/314 |
| 2011/0108928 A1* | 5/2011 | Tao ................... H01L 29/66545 257/410 |
| 2011/0143529 A1 | 6/2011 | Lee et al. |
| 2011/0175147 A1* | 7/2011 | Adusumilli ....... H01L 21/28088 257/E21.177 |
| 2012/0012937 A1* | 1/2012 | Chew .............. H01L 21/823842 257/369 |
| 2012/0248507 A1* | 10/2012 | Liu ....................... H01L 29/513 257/288 |
| 2012/0264284 A1 | 10/2012 | Wang et al. |
| 2012/0319214 A1* | 12/2012 | Ma ...................... H01L 29/7833 438/585 |
| 2012/0326238 A1* | 12/2012 | Chien .................. H01L 29/165 438/585 |
| 2013/0017678 A1* | 1/2013 | Tsai ..................... H01L 29/513 257/E21.333 |

* cited by examiner

METHOD OF MANUFACTURING A SEMICONDUCTOR DEVICE INCLUDING CAPPING LAYER, BARRIER LAYER AND WORK FUNCTION LAYER

PRIORITY CLAIM

This application is a divisional of U.S. application Ser. No. 15/693,874, filed Sep. 1, 2017, which is a continuation of U.S. application Ser. No. 13/192,718, filed Jul. 28, 2011, now U.S. Pat. No. 9,755,039, issued Sep. 5, 2017, which are herein incorporated by reference in their entireties.

TECHNICAL FIELD

The disclosure relates to semiconductor devices and methods of manufacturing the same.

BACKGROUND

In a semiconductor device such as metal-oxide-semiconductor field-effect transistors (MOSFETs), metals have been introduced as gate electrode materials in order to avoid the polysilicon depletion effect in a doped polysilicon gate electrode. A replacement-gate (RPG) process has been introduced for fabricating a metal gate electrode. As device dimensions shrink and the gate length is scaled down, it is difficult to form a void-free metal gate structure in the RPG process.

DETAILED DESCRIPTION

Figure 1:
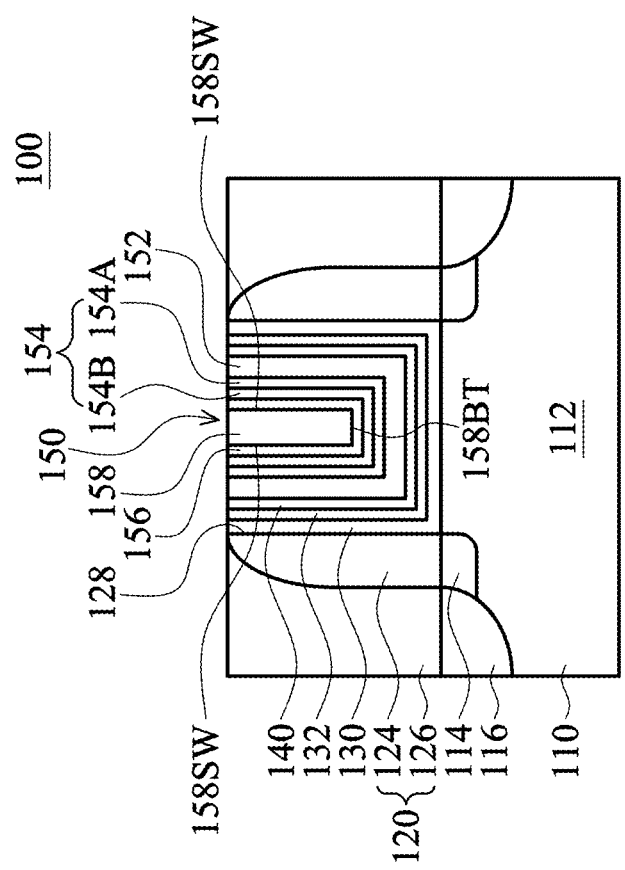
FIG. 1 is a cross-sectional view of a semiconductor device having a metal gate electrode stack according to an embodiment.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIG. 1 is a cross-sectional view of a semiconductor device 100 according to an embodiment of the present disclosure. The semiconductor device 100 comprises a substrate 110 having an active area 112. Lightly doped drain (LDD) regions 114 and source/drain regions 116 are formed in the active area 112 of the substrate 110. An inter-layer dielectric pattern 120 is formed on the active area 112 of the substrate 110. The inter-layer dielectric pattern 120 includes insulating spacers 124 and insulating patterns 126. The inter-layer dielectric pattern 120 defines a gate trench 128 formed through the inter-layer dielectric pattern 120 on the active area 112 of the substrate 110. In some embodiments, the insulating spacers 124 include an oxide layer, a nitride layer, or a combination thereof. In some embodiments, the insulating patterns 126 include a silicon oxide layer or an insulating layer having low dielectric constant (low-k) dielectric characteristics.

A gate dielectric layer 130 is formed on and contacting a top surface of the active area 112 and sidewalls of the inter-layer dielectric pattern 120. In one or more embodiments, the gate dielectric layer 130 is formed of at least one of high-k dielectric materials, silicon oxide, silicon nitride, or silicon oxynitride. The high-k dielectric materials include materials having a dielectric constant greater than silicon dioxide. The high-k dielectric materials suitable for the gate dielectric layer 130 include hafnium oxide, hafnium oxide doped with Zr, aluminum oxide, titanium oxide, zirconium oxide, indium oxide, lanthanum oxide, yttrium oxide, hafnium silicon oxide, hafnium aluminum oxide, aluminum silicon oxide, titanium silicon oxide, zirconium silicon oxide, strontium oxide, strontium titanium oxide, yttrium silicon oxide, and combinations thereof, but are not limited by the above-mentioned materials. In some embodiments, the gate dielectric layer 130 has a stack structure of two or more dielectric layers. In one or more embodiments, the gate dielectric layer 130 has a stack structure of an interfacial dielectric layer, such as a silicon oxide layer, and a high-k material layer overlying the interfacial dielectric layer. In some embodiments, the gate dielectric layer 130 has a thickness in the range of about 1 to 4 nanometers (nm).

A capping layer 132 and a barrier layer 140 are sequentially formed on the gate dielectric layer 130. In one or more embodiments, the capping layer 132 and the barrier layer 140 are optional. A metal gate electrode stack 150 fills the remainder of the gate trench 128 on the barrier layer 140. The metal gate electrode stack 150 includes a work function layer 152, a metal diffusion blocking layer 154, a wetting layer 156, and a metal filling line 158 sequentially formed on the barrier layer 140.

The metal filling line 158 is composed of a line-shaped metal layer extending along and within the gate trench 128. The metal filling line 158 has sidewalls 158SW facing the sidewalls of the inter-layer dielectric pattern 120 and a bottom surface 158BT facing the active area 112. The wetting layer 156 is in contact with at least a portion of the sidewalls 158SW and at least a portion of the bottom surface 158BT of the metal filling line 158. The metal diffusion blocking layer 154 is in contact with at least a portion of the wetting layer 156 and covers at least a portion of the sidewalls 158SW and at least a portion of the bottom surface 158BT of the metal filling line 158 with the wetting layer 156 therebetween. The work function layer 152 covers the sidewalls 158SW and the bottom surface 158BT of the metal filling line 158 with the wetting layer 156 and the metal diffusion blocking layer 154 therebetween.

In one or more embodiments, the wetting layer 156 extends to continuously or intermittently cover the metal filling line 158 along the sidewalls 158SW and the bottom surface 158BT thereof. In some embodiments, the metal diffusion blocking layer 154 extends to continuously or intermittently cover the wetting layer 156 along the sidewalls 158SW and the bottom surface 158BT of the metal filling line 158. In some embodiments, a top portion of the sidewalls 158SW or the immediate vicinity of a top surface of the metal filling line 158 is covered by the metal diffusion blocking layer 154 and/or the wetting layer 156.

The metal filling line 158 is positioned in the middle with regard to distance from the sidewalls of the inter-layer dielectric pattern 120 at the entrance of the gate trench 128. In some embodiments, the metal filling line 158 comprises at least one of aluminum (Al), copper (Cu), AlCu, or tungsten (W), but is not limited by the above-mentioned materials.

As device dimensions shrink and the gate length becomes scaled down, the phenomenon of electromigration in the metal filling line 158 can cause voids in the vicinity of the metal filling line 158 within the gate trench 128. The voids generated in a gate electrode may deteriorate an electrical characteristic and reliability of the gate electrode, increase the resistance of the gate electrode, and/or weaken the structural integrity of the gate electrode. Electromigration is the movement or diffusion of atoms in a metal line, for example, caused by current flow through the metal line. Diffusion of metal ions from the sidewalls 158SW and the bottom surface 158BT of the metal filling line 158 may lead to voids in the metal gate electrode stack 150. The wetting layer 156 and the metal diffusion blocking layer 154 are formed to cover the sidewalls 158SW and the bottom surface 158BT of the metal filling line 158. Therefore, the wetting layer 156 and the metal diffusion blocking layer 154 inhibit diffusion of metal ions from the metal filling line 158 to adjacent layers, thereby inhibiting the formation of the undesirable voids in the vicinity of the metal filling line 158 of the metal gate electrode stack 150.

Further, the wetting layer 156 contacts with the sidewalls 158SW and the bottom surface 158BT of the metal filling line 158 between the metal filling line 158 and the metal diffusion blocking layer 154 as depicted in FIG. 1. In one or more embodiments, the wetting layer 156 is a metal layer which forms bonds to the metal filling line 158. The wetting layer 156 enables the metal filling line 158 to have improved filling characteristics in the gate trench 128, and therefore results in a continuous void-free metal gate electrode stack by facilitating filling of the gate trench 128 with the metal such as Al, Cu, or alloys thereof for forming the metal filling line 158 without leaving unfilled voids therein. The wetting layer 156 includes at least one of cobalt (Co), Ti, or Ta. In some embodiments, the wetting layer 156 has a thickness in the range of about 1 to 5 nm.

The metal diffusion blocking layer 154 is in contact with the wetting layer 156 between the wetting layer 156 and the work function layer 152. The metal diffusion blocking layer 154 includes a metal nitride. For example, the metal diffusion blocking layer 154 includes at least one of a Ti-rich TiN layer, a TaN layer, or a TiN layer. The Ti-rich TiN layer has a relatively large content of Ti in comparison with a stoichiometric TiN layer consisting of a 1:1 mixture of Ti and N atoms. That is, the Ti-rich TiN layer has more than 50 atomic percent Ti content therein. The metal diffusion blocking layer 154 has a stack structure of a first metal nitride layer 154A and a second metal nitride layer 154B. The first metal nitride layer 154A and the second metal nitride layer 154B comprise different compositions of metal nitride from each other. For example, the metal diffusion blocking layer 154 has the first metal nitride layer 154A comprising TiN, and the second metal nitride layer 154B comprising Ti-rich TiN. Alternatively, the metal diffusion blocking layer 154 has the first metal nitride layer 154A comprising TiN, and the second metal nitride layer 154B comprising TaN. The first metal nitride layer 154A of the metal diffusion blocking layer 154 contacts with the work function layer 152. The second metal nitride layer 154B of the metal diffusion blocking layer 154 contacts with the wetting layer 156. In some embodiments, the first metal nitride layer 154A and the second metal nitride layer 154B of the metal diffusion blocking layer 154 have thicknesses in the range of about 1 to 5 nm.

The work function layer 152 is interposed between the barrier layer 140 and the metal diffusion blocking layer 154, and faces the sidewalls 158SW and the bottom surface 158BT of the metal filling line 158 within the gate trench 128. In one or more embodiments, the work function layer 152 comprises at least one of Ti, Al, TiAl, TiN, Co, WN, or TaC. For example, the work function layer 152 comprises at least one of Ti, Al, or TiAl when the metal gate electrode stack 150 is part of an N-channel MOS (NMOS) transistor of a complementary MOS (CMOS) device. Alternatively, the work function layer 152 comprises at least one of TiN, Co, WN, or TaC when the metal gate electrode stack 150 is part of a P-channel MOS (PMOS) transistor of the CMOS device. In some embodiments, the work function layer 152 has a thickness in the range of about 1 to 10 nm.

The work function layer 152 is in contact with the barrier layer 140. In some embodiments, additional one or more metallic layers (not shown) are interposed between the work function layer 152 and the barrier layer 140 such that the work function layer 152 and the barrier layer 140 are not in direct contact.

The capping layer 132 conformally covers the gate dielectric layer 130 while contacting with a top surface of the gate dielectric layer 130. In some embodiments, the capping layer 132 includes at least one of metal nitrides such as titanium nitride (TiN) and tantalum nitride (TaN), metal carbides such as tantalum carbide (TaC), and combinations thereof. In one or more embodiments, the capping layer 132 has a thickness in the range of about 1 to 5 nm.

The barrier layer 140 is interposed between the capping layer 132 and the work function layer 152. In some embodiments, the barrier layer 140 comprises at least one conductive barrier material selected from metals, metal nitrides, or metal alloys. For example, the barrier layer 140 may include at least one conductive barrier material selected from TiN, TaN, TaC, or WN, but is not limited by the above-mentioned materials. In some embodiments, the barrier layer 140 has a thickness in the range of about 1 to 5 nm.

Figure 2:
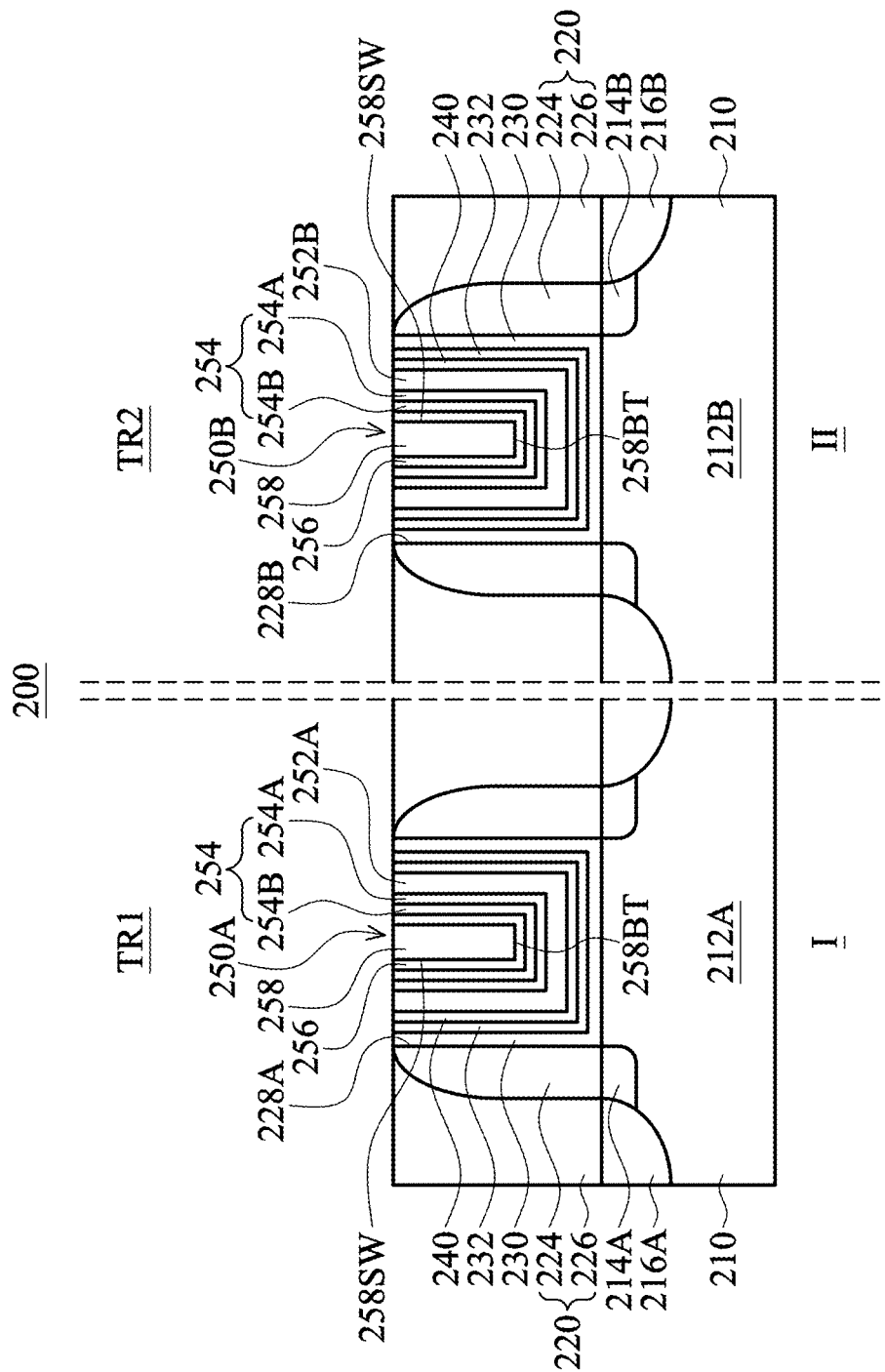
FIG. 2 is a cross-sectional view of a semiconductor device having metal gate electrode stacks according to another embodiment.

FIG. 2 is a cross-sectional view of a semiconductor device 200 according to another embodiment of the present disclosure. In some embodiments, the semiconductor device 200 can be part of CMOS transistors included in a logic device. In FIG. 2, the features are the same as or similar to like-numbered features described with respect to FIG. 1. For example, an element "2xx" in FIG. 2 is the same as or similar to an element "1xx" in FIG. 1. Therefore, the descriptions thereof will be omitted to avoid repetition.

The semiconductor device 200 comprises a substrate 210 having a first region I and a second region II as divided by dotted lines in FIG. 2. A first MOS transistor TR1 is formed in the first region I, and a second MOS transistor TR2 is formed in the second region II. In some embodiments, a first active area 212A of the first region I and a second active area 212B of the second region II are divided by an isolation layer (not shown) formed in the substrate 210.

First LDD regions 214A and first source/drain regions 216A are formed in the first active area 212A of the first region I. In one or more embodiments, the first region I is an NMOS region in which an NMOS transistor is formed as the first MOS transistor TR1. Additionally, N-type LDD regions and N-type source/drain regions are formed in the first active area 212A as the first LDD regions 214A and first source/drain regions 216A, respectively.

Second LDD regions 214B and second source/drain regions 216B are formed in the second active area 212B of the second region II. In one or more embodiments, the second region II is a PMOS region in which a PMOS transistor is formed as the second MOS transistor TR2. Also, P-type LDD regions and P-type source/drain regions are formed in the second active area 212B as the second LDD regions 214B and second source/drain regions 216B, respectively.

An inter-layer dielectric pattern 220 is formed on the first active area 212A of the first region I and on the second active area 212B of the second region II. The inter-layer dielectric pattern 220 includes insulating spacers 224 and insulating patterns 226. A first gate trench 228A and a second gate trench 228B are formed through the inter-layer dielectric pattern 220 on the first active area 212A and the second active area 212B, respectively.

A gate dielectric layer 230 is formed on the first active area 212A and the second active area 212B. Within the first gate trench 228A, the gate dielectric layer 230 is formed to cover and contact a top surface of the first active area 212A and sidewalls of the inter-layer dielectric pattern 220 defining the first gate trench 228A. Within the second gate trench 228B, the gate dielectric layer 230 is formed to cover and contact a top surface of the second active area 212B and sidewalls of the inter-layer dielectric pattern 220 defining the second gate trench 228B.

The first gate trench 228A is filled with a first metal gate electrode stack 250A over the gate dielectric layer 230 to form the first MOS transistor TR1. The first metal gate electrode stack 250A includes a first work function layer 252A, a metal diffusion blocking layer 254, a wetting layer 256, and a metal filling line 258 sequentially formed over the gate dielectric layer 230. The metal filling line 258 formed in the first region I has sidewalls 258SW facing the sidewalls of the inter-layer dielectric pattern 220 and bottom surface 258BT facing the first active area 212A. The metal diffusion blocking layer 254 has a stack structure of a first metal nitride layer 254A and a second metal nitride layer 254B. When the first MOS transistor TR1 is an NMOS transistor, the first work function layer 252A comprises one or more metals needed for a work function suitable for the NMOS transistor. In some embodiments, the first work function layer 252A comprises at least one of Ti, Al, or TiAl.

The second gate trench 228B is filled with a second metal gate electrode stack 250B over the gate dielectric layer 230 to form the second MOS transistor TR2. The second metal gate electrode stack 250B includes a second work function layer 252B, the metal diffusion blocking layer 254, the wetting layer 256, and the metal filling line 258 sequentially formed over the gate dielectric layer 230. The metal filling line 258 formed in the second region II has sidewalls 258SW facing the sidewalls of the inter-layer dielectric pattern 220 and bottom surface 258BT facing the second active area 212B. When the second MOS transistor TR2 is a PMOS transistor, the second work function layer 252B comprises one or more metals needed for a work function suitable for the PMOS transistor. In some embodiments, the second work function layer 252B comprises at least one of TiN, Co, WN, or TaC.

A capping layer 232 is interposed between the gate dielectric layer 230 and the first work function layer 252A in the first region I, and between the gate dielectric layer 230 and the second work function layer 252B in the second region II. A barrier layer 240 is formed between the capping layer 232 and the first work function layer 252A in the first region I, and between the capping layer 232 and the second work function layer 252B in the second region II.

In various embodiments of the semiconductor device 100 or 200 according to the present disclosure, the metal gate electrode stack 150, 250A, or 250B includes the metal filling line 158 or 258, the wetting layer 156 or 256 being in contact with the sidewalls 158SW or 258SW and the bottom surface 158BT or 258BT of the metal filling line 158 or 258, and the metal diffusion blocking layer 154 or 254 being in contact with the wetting layer 156 or 256 and covering the sidewalls 158SW or 258SW and the bottom surface 158BT or 258BT of the metal filling line 158 or 258 with the wetting layer 156 or 256 therebetween. The wetting layer 156 or 256 includes at least one of Co, Ti, or Ta. The metal diffusion blocking layer 154 or 254 has at least one metal nitride layer including at least one of Ti-rich TiN, TaN, or TiN. The stack structure of the metal diffusion blocking layer 154 or 254 and the wetting layer 156 or 256 covering the sidewalls 158SW or 258SW and the bottom surfaces 158BT or 258BT of the metal filling line 158 or 258 can inhibit diffusion of metal ions from the metal filling line 158 or 258, thereby inhibiting the formation of the undesirable voids in the metal gate electrode stack 150, 250A, or 250B.

FIGS. 3A through 3I are cross-sectional views for a method of manufacturing a semiconductor device, according to an embodiment of the present disclosure.

In the embodiments described with reference to FIGS. 3A through 3I, the method of manufacturing the semiconductor device according to the present disclosure is applied to a process for manufacturing a CMOS transistors of a logic device, in particular, to a process for manufacturing the semiconductor device 200 depicted in FIG. 2.

Figure 3A:
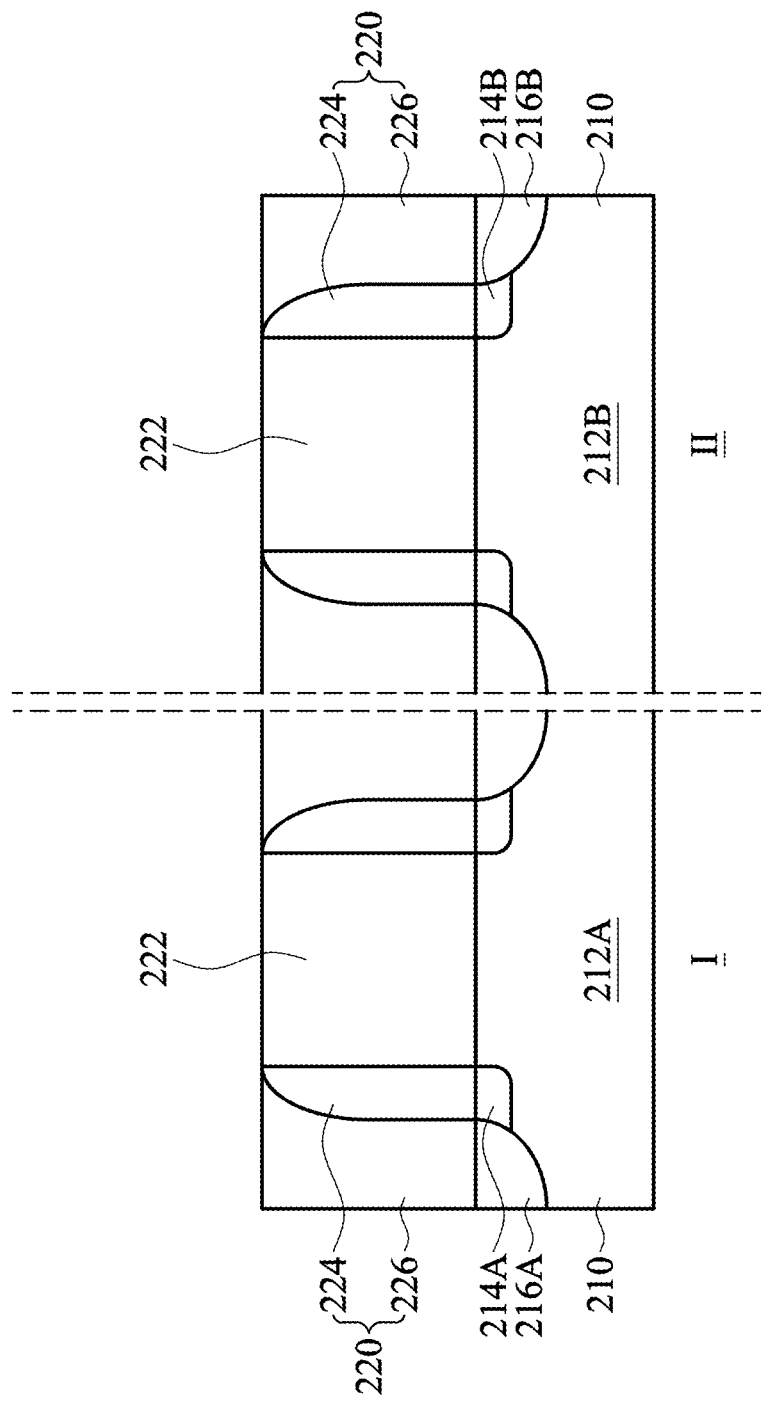
FIGS. 3A-3I are cross-sectional views for a method of manufacturing a semiconductor device according to an embodiment.

Referring to FIG. 3A, an isolation layer (not shown) is formed in the substrate 210 having the first region I and the second region II so as to define a plurality of active areas including the first active area 212A and the second active area 212B. Then, dummy gate patterns 222 are formed on the substrate 210 in the first region I and the second region II. In some embodiments, the first region I and the second region II are divided by the isolation layer (not shown) formed of any one selected from an oxide layer, a nitride layer, or a combination thereof. In some embodiments, the first region I is the NMOS region, and the second region II is the PMOS region. In one or more embodiments, the substrate 210 is formed of silicon, and the dummy gate patterns 222 are formed of polysilicon, although neither of the substrate 210 and the dummy gate patterns 222 is particularly limited thereto.

The insulating spacers 224 are formed to cover sidewalls of each of the dummy gate patterns 222. In some embodiments, the insulating spacers 224 are formed of an oxide layer, a nitride layer, or a combination thereof.

In some embodiments, before the insulating spacers 224 are formed, first ion implantation processes are performed to form the first LDD regions 214A and the second LDD regions 214B in the first active area 212A and the second active area 212B, respectively, by using the dummy gate patterns 222 as first ion implantation masks. After the insulating spacers 224 are formed, second ion implantation processes are performed on the first active area 212A and the second active area 212B, respectively, by using the dummy gate patterns 222 and the insulating spacers 224 as second ion implantation masks. Additionally, an annealing process is performed to form the first source/drain regions 216A and the second source/drain regions 216B in the first active area 212A and the second active area 212B, respectively. During the first and second ion implantation processes, N-type dopant ions are implanted in the first region I in order to form N-type LDD regions and N-type source/drain regions as the first LDD regions 214A and the first source/drain regions 216A, respectively. Additionally, during the first and second ion implantation processes, P-type dopant ions are implanted in the second region II, in order to form P-type LDD regions and P-type source/drain regions as the second LDD regions 214B and the second source/drain regions 216B, respectively.

Then, the insulating patterns 226 are formed in each of a plurality of spaces defined by the insulating spacers 224 between each of the dummy gate patterns 222. In some embodiments, the insulating patterns 226 are formed of silicon oxide or insulating material having a low dielectric constant. In order to form the insulating patterns 226, an insulating material is deposited on the substrate 210 so as to have a thickness sufficient to fill the plurality of spaces defined by the insulating spacers 224 between each of the dummy gate patterns 222, and then a planarization process, such as chemical mechanical polishing (CMP), may be performed thereon until top surfaces of the dummy gate patterns 222 are exposed.

Figure 3B:
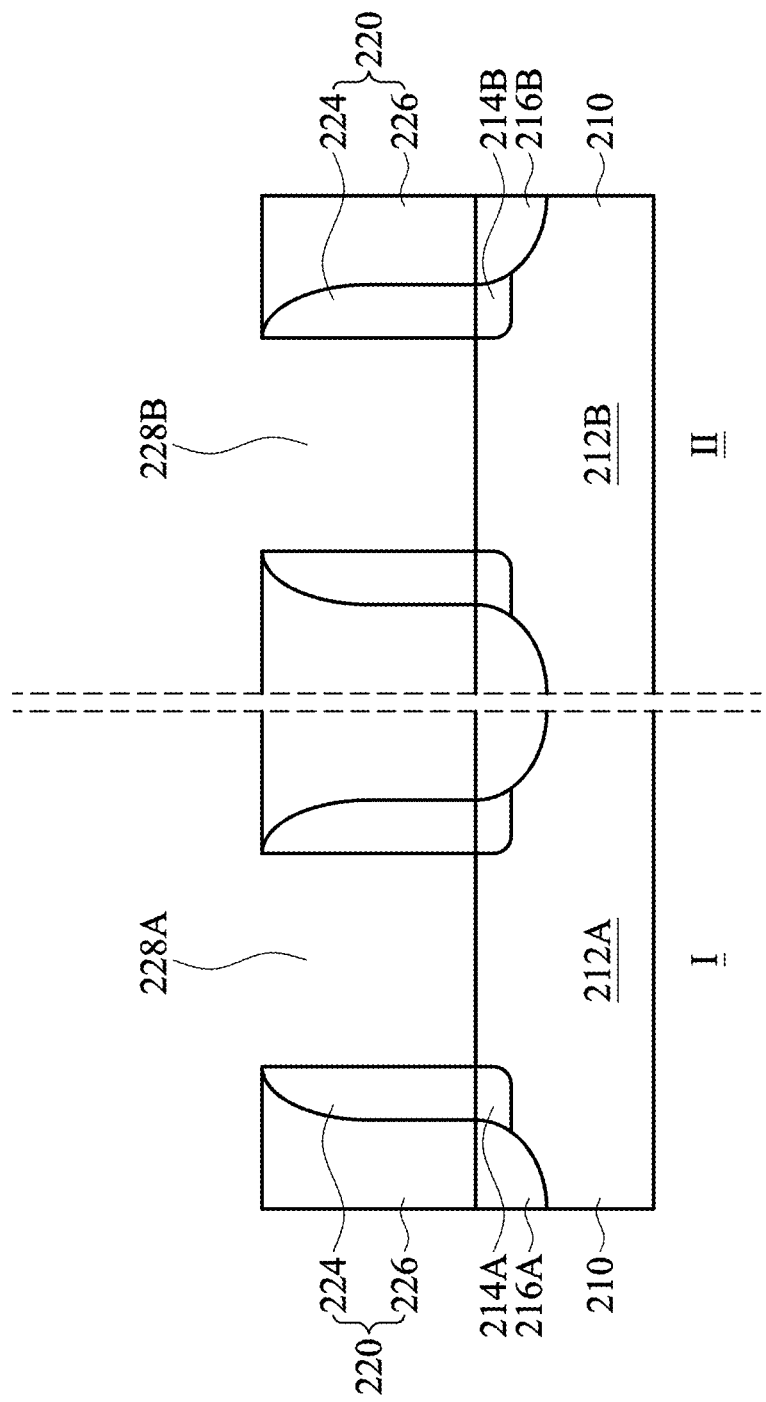

Referring to FIG. 3B, the dummy gate patterns 222 are removed from the first region I and the second region II, so that the first active area 212A and the second active area 212B of the substrate 210 are exposed through the first gate trench 228A and the second gate trench 228B, respectively. In some embodiments, the dummy gate patterns 222 are removed by using a wet etching process.

Figure 3C:
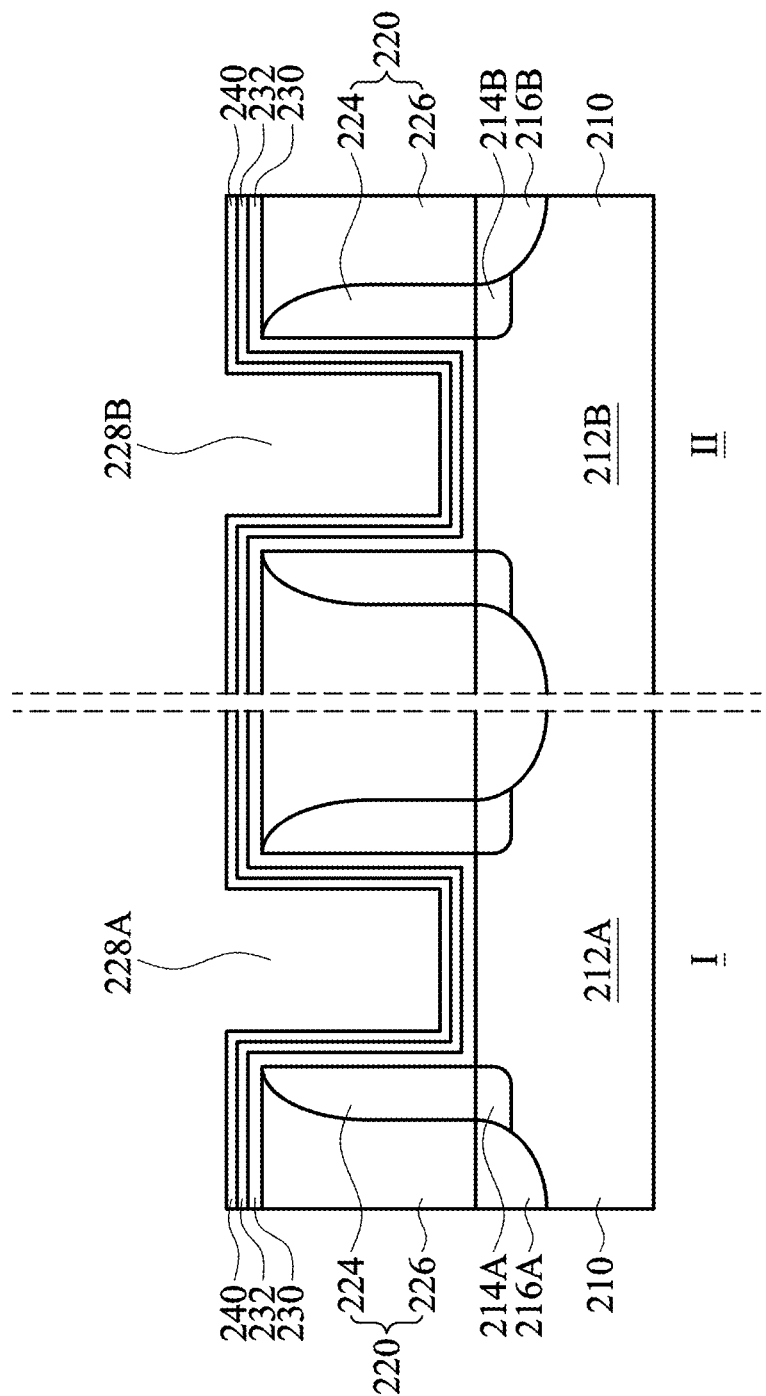

Referring to FIG. 3C, the gate dielectric layer 230 is formed to conformally cover the top surfaces of the first and second active areas 212A and 212B and the sidewalls of the inter-layer dielectric pattern 220 exposed through the first and second gate trenches 228A and 228B, respectively. Then, the capping layer 232 and the barrier layer 240 are sequentially formed on the gate dielectric layer 230.

In one or more embodiments, the gate dielectric layer 230 is formed to have a stack structure of an interfacial dielectric layer, such as a $SiO_2$ layer, and a high-k material layer overlying the interfacial dielectric layer. In some embodiments, the gate dielectric layer 230 is formed by a thermal oxidation process, an atomic layer deposition (ALD) process, a chemical vapor deposition (CVD) process, a physical vapor deposition (PVD) process, or combinations thereof. In some embodiments, the gate dielectric layer 230 is formed to have a thickness in the range of about 1 to 4 nm.

In one or more embodiments, the capping layer 232 is formed to include at least one of metal nitrides such as TiN and TaN, metal carbides such as TaC, and combinations thereof. In some embodiments, the capping layer 232 is formed by an ALD process, a CVD process, a PVD process, or combinations thereof. In some embodiments, the capping layer 232 is formed to have a thickness in the range of about 1 to 5 nm.

In one or more embodiments, the barrier layer 240 is formed to comprise at least one conductive barrier material selected from metals or metal nitrides. In some embodiments, the barrier layer 240 includes at least one conductive barrier material selected from TiN, TaN, TaC, or WN, but is not limited by the above-mentioned materials. In some embodiments, the barrier layer 240 is formed by an ALD process, a CVD process, a PVD process, or combinations thereof. In some embodiments, the barrier layer 240 is formed to have a thickness in the range of about 1 to 5 nm.

Figure 3D:
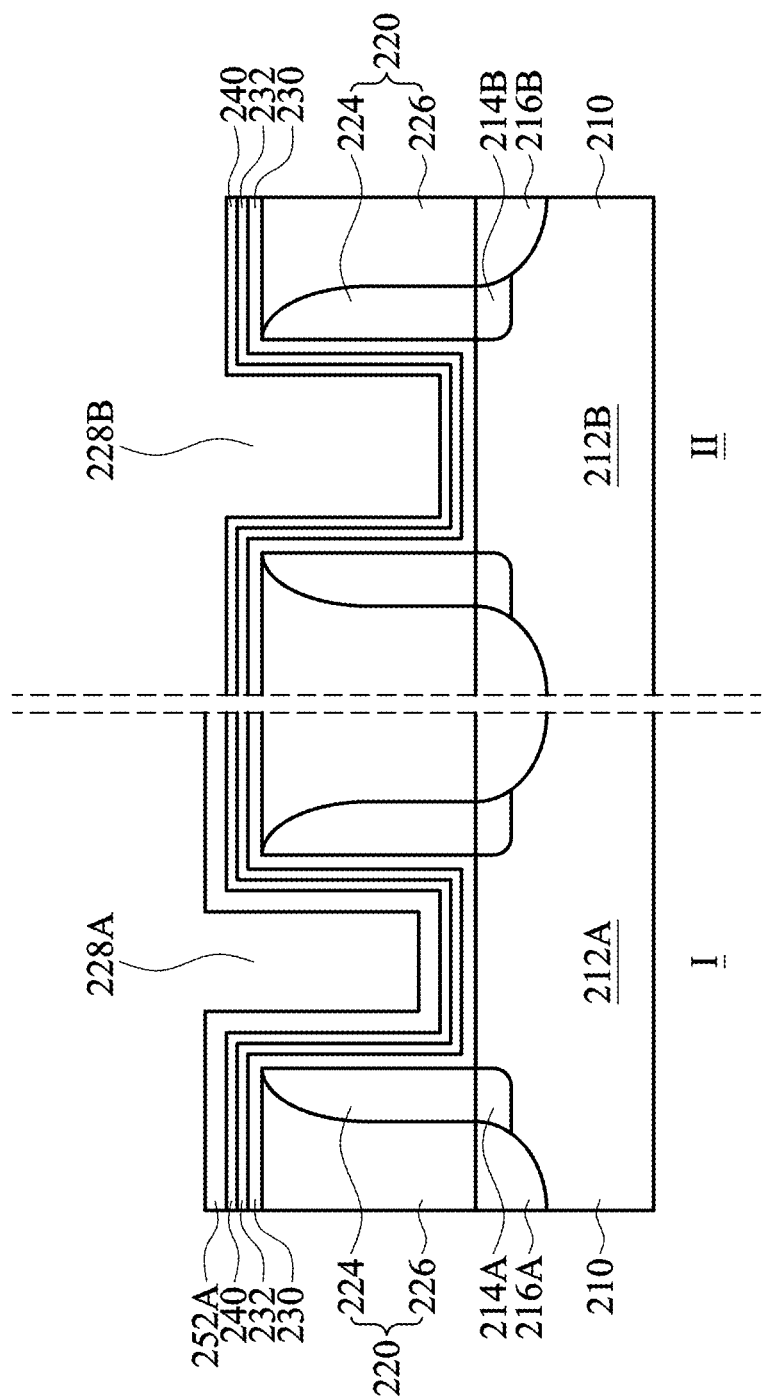

Referring to FIG. 3D, the first work function layer 252A is formed on the barrier layer 240 in the first region I. In the case of forming an NMOS transistor in the first region I, the first work function layer 252A is formed to comprise at least one of Ti, Al, or TiAl. In some embodiments for forming the first work function layer 252A in the first region I, blanket deposition of metallic material for forming a first metallic layer is performed on the entire exposed top surface of the resultant structure on which the barrier layer 240 is formed. Then, an unnecessary portion of the first metallic layer is removed from the substrate 210 by using a suitable etch mask layer (not shown) covering a portion of the first metallic layer to leave the first work function layer 252A resulting from the portion of the first metallic layer in the first region I. In some embodiments, the first work function layer 252A is formed by an ALD process, a CVD process, a PVD process, or combinations thereof. In some embodiments, the first work function layer 252A is formed to have a thickness in the range of about 1 to 10 nm.

Figure 3E:
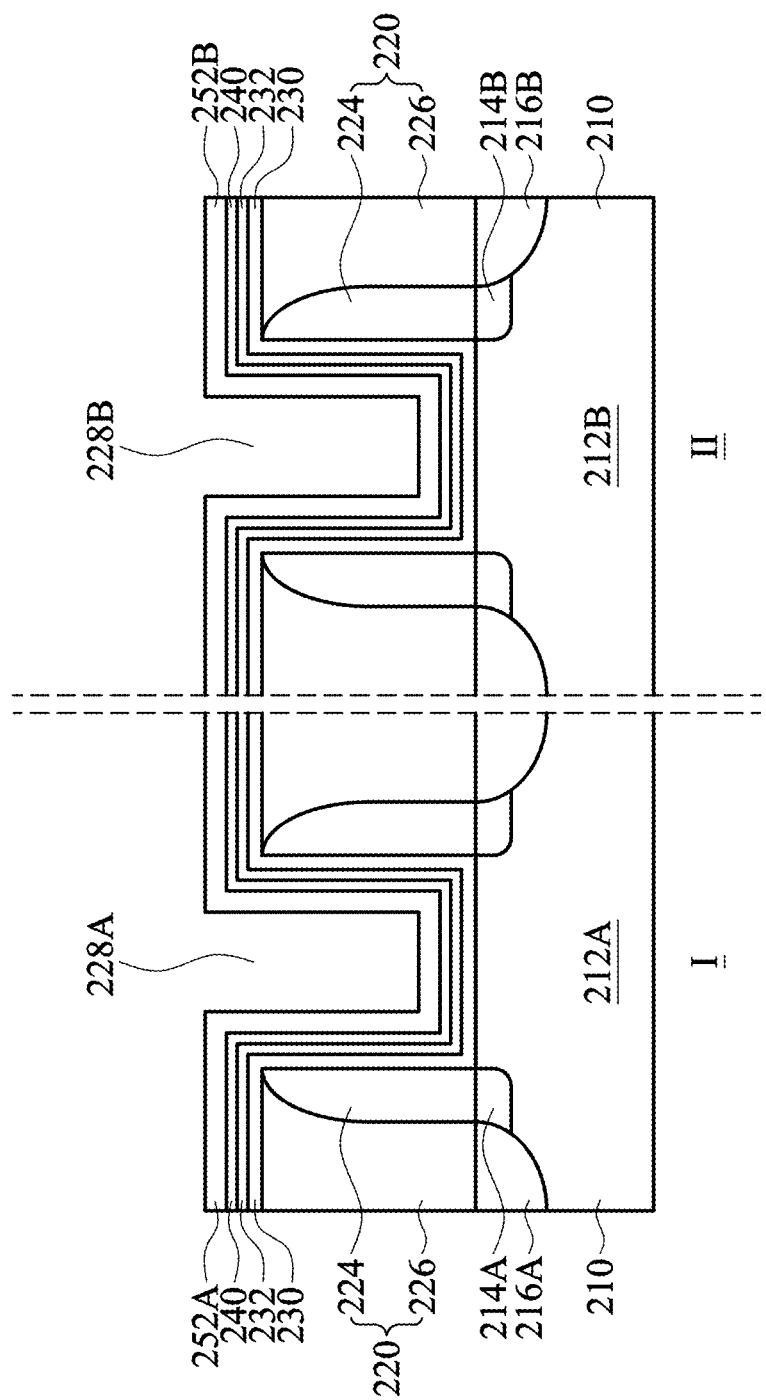

Referring to FIG. 3E, the second work function layer 252B is formed on the barrier layer 240 in the second region II. In the case of forming a PMOS transistor in the second region II, the second work function layer 252B is formed to comprise at least one of TiN, Co, WN, or TaC. In some embodiments for forming the second work function layer 252B in the second region II, blanket deposition for forming a second metallic layer is performed on the entire exposed top surface of the resultant structure on which the first work function layer 252A and the barrier layer 240 are exposed in the first region I and the second region II, respectively. Then, an unnecessary portion of the second metallic layer is removed from the substrate 210 by using a suitable etch mask layer (not shown) covering a portion of the second metallic layer to leave the second work function layer 252B resulting from the portion of the second metallic layer in the second region II. In some embodiments, the second work function layer 252B is formed by an ALD process, a CVD process, a PVD process, or combinations thereof. In some embodiments, the second work function layer 252B is formed to have a thickness in the range of about 1 to 10 nm.

In the exemplified embodiment described above with reference to FIGS. 3D and 3E, the first work function layer 252A is formed before the formation of the second work function layer 252B. However, the first work function layer 252A may be formed after the formation of the second work function layer 252B, in accordance with the spirit and scope of embodiment of the disclosure.

Figure 3F:
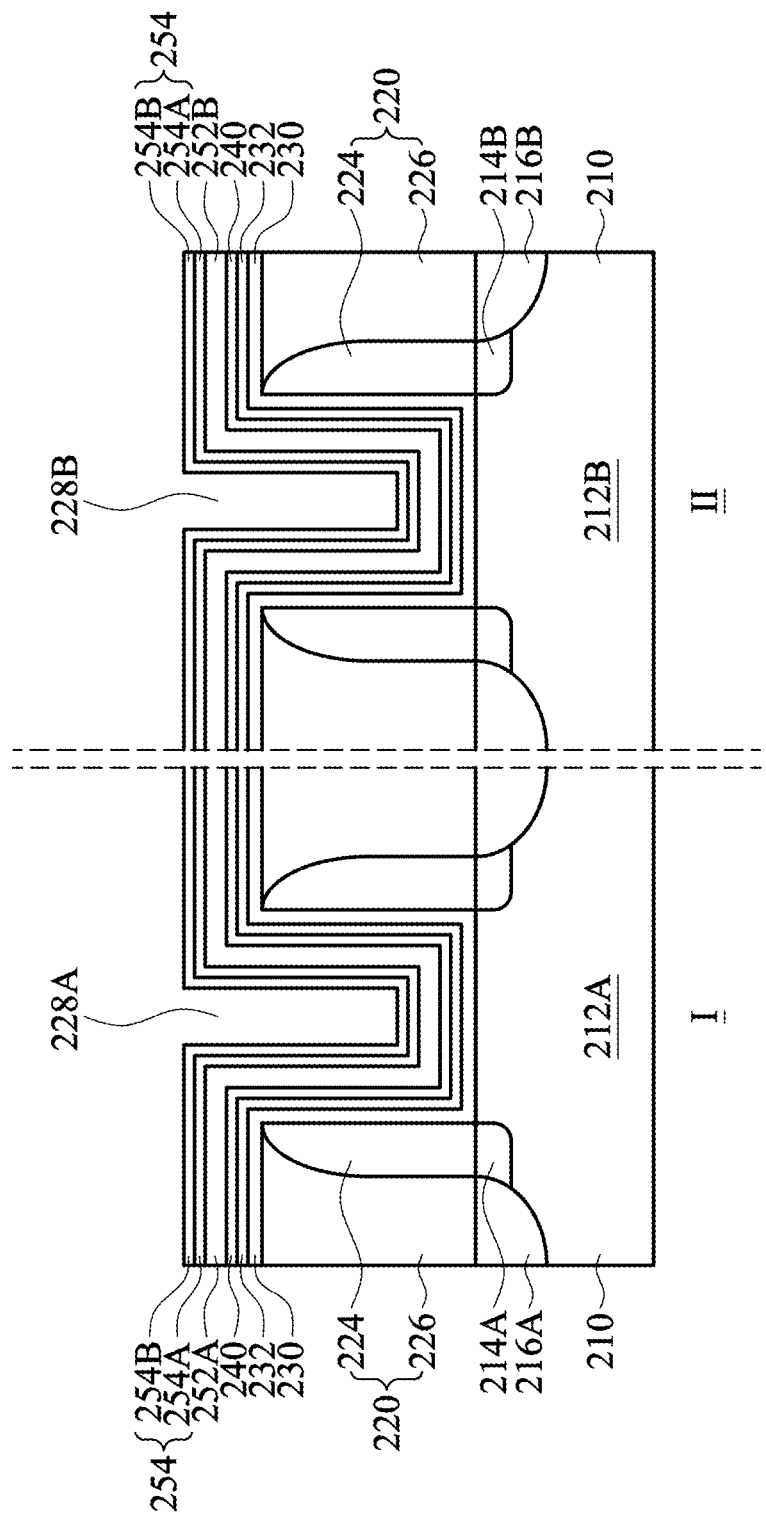

Referring to FIG. 3F, the metal diffusion blocking layer 254 is formed on the first work function layer 252A and the second work function layer 252B in the first region I and the second region II. The metal diffusion blocking layer 254 is formed to have the stack structure of the first metal nitride layer 254A and the second metal nitride layer 254B. In some embodiments, the metal diffusion blocking layer 254 is formed to have a stack structure of a TiN layer and a Ti-rich TiN layer as the stack structure of the first metal nitride layer 254A and the second metal nitride layer 254B. Alternatively, the metal diffusion blocking layer 254 is formed to have a stack structure of a TiN layer and a TaN layer as the stack structure of the first metal nitride layer 254A and the second metal nitride layer 254B. In some embodiments, each of the first metal nitride layer 254A and the second metal nitride layer 254B of the metal diffusion blocking layer 254 is formed by an ALD process, a CVD process, a PVD process, or combinations thereof. In some embodiments, each of the first metal nitride layer 254A and the second metal nitride layer 254B of the metal diffusion blocking layer 254 is formed to have thicknesses in the range of about 1 to 5 nm.

Figure 3G:
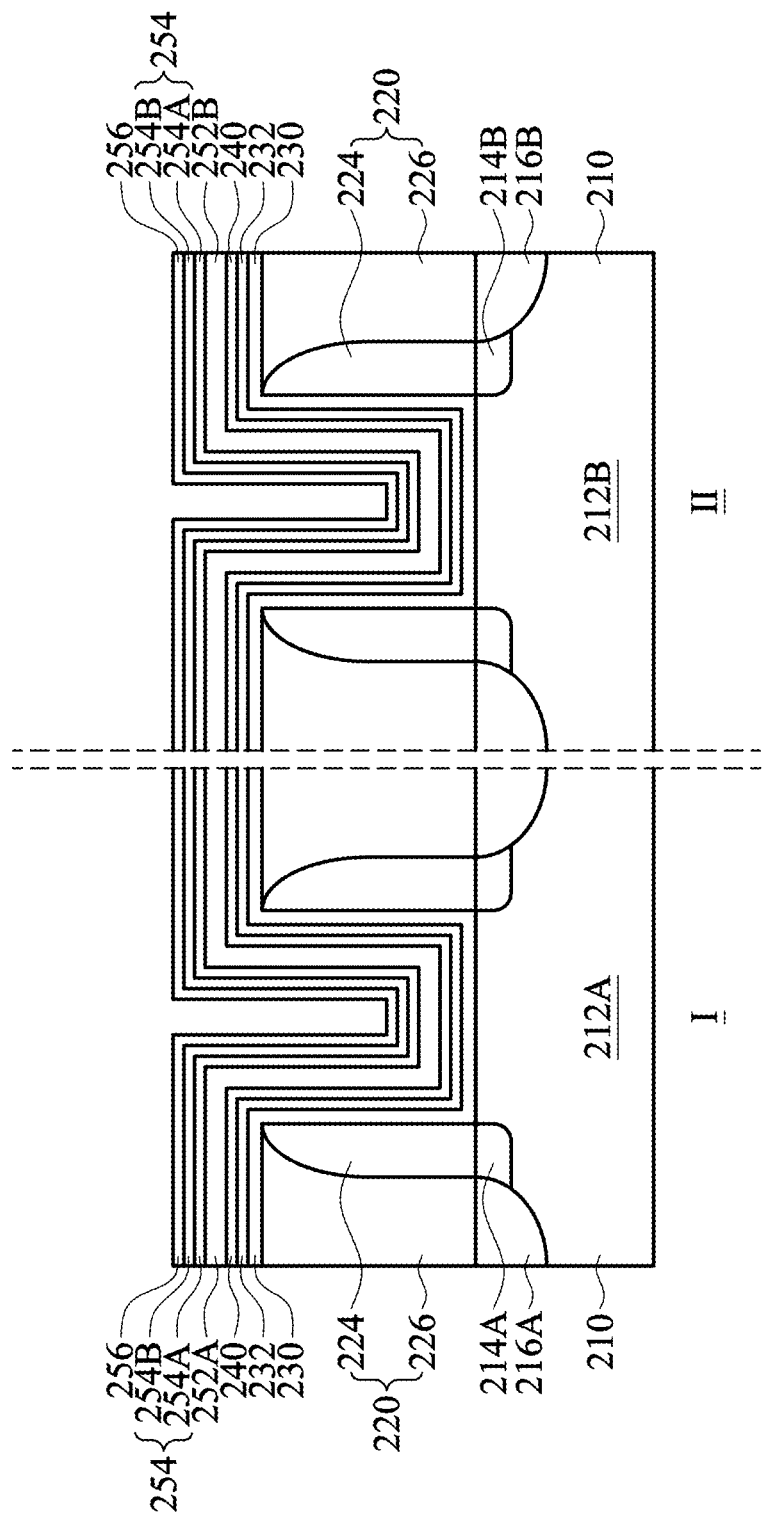

Referring to FIG. 3G, the wetting layer 256 is formed on the metal diffusion blocking layer 254 in the first region I and the second region II. The wetting layer 256 is formed to include at least one of Co, Ti, or Ta. In one or more embodiments, the wetting layer 256 is formed by a CVD process, although not particularly limited thereto. In some embodiments, the wetting layer 256 is formed to have a thickness in the range of about 1 to 5 nm.

Figure 3H:
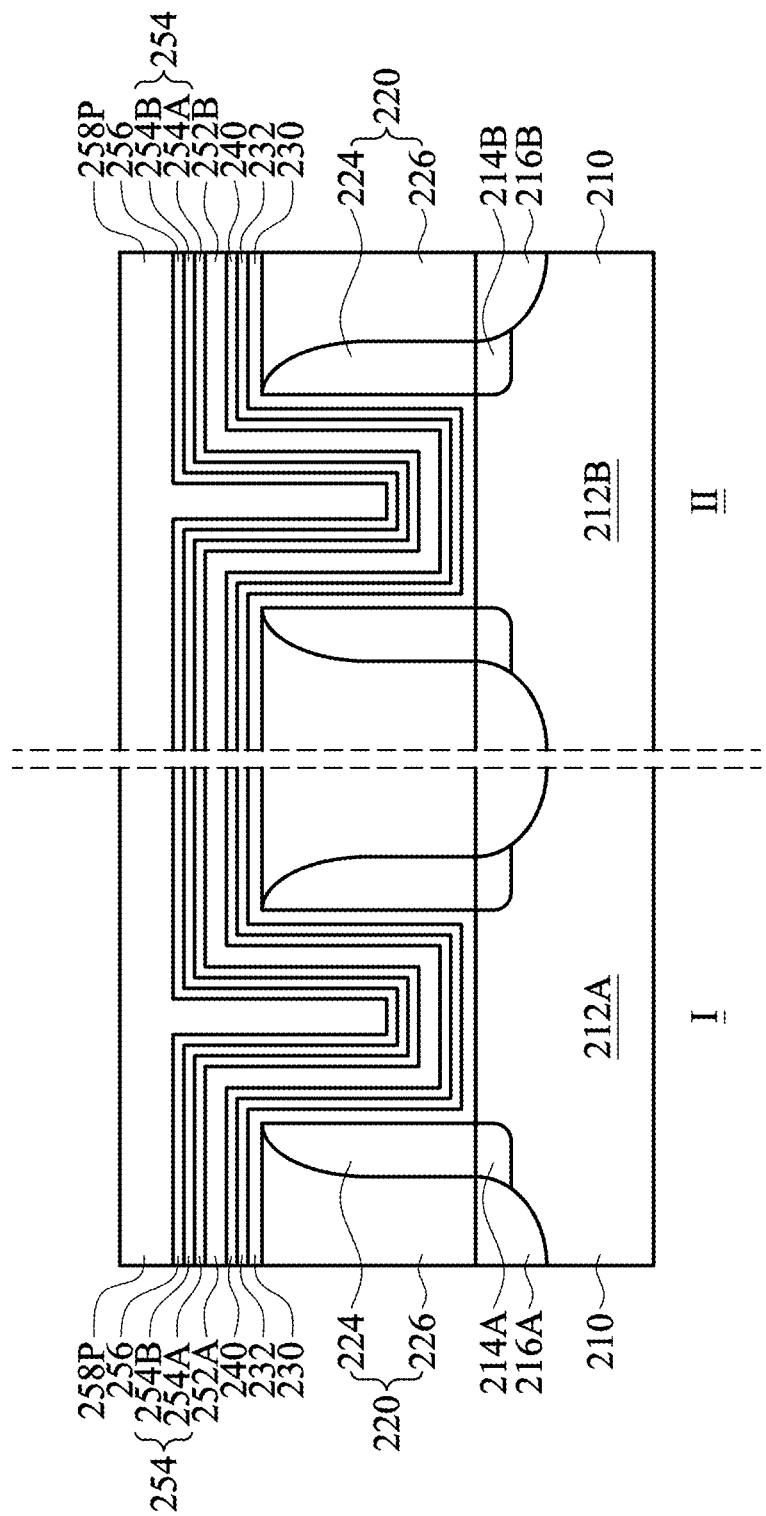

Referring to FIG. 3H, a metal filling layer 258P is formed to have a thickness sufficient to fill the first gate trench 228A and the second gate trench 228B on the wetting layer 256 in the first region I and the second region II. In some embodiments, the metal filling layer 258P is formed to comprise at least one of Al, Cu, or AlCu, but is not limited by the above-mentioned materials. In some embodiments, the metal filling layer 258P is formed by a PVD process, although not particularly limited thereto. After the remainder of the first gate trench 228A and the second gate trench 228B is filled with the metal filling layer 258P on the wetting layer 256, the resultant structure having the metal filling layer 258P is thermally treated at a temperature sufficiently high enough to cause reflow of the metal filling layer 258P, for example at a temperature of about 300-600° C. By the reflow process as described above, materials of the metal filling layer 258P can flow within the first gate trench 228A and the second gate trench 228B, thereby promoting complete filling of the first gate trench 228A and the second gate trench 228B without voids.

Figure 3I:
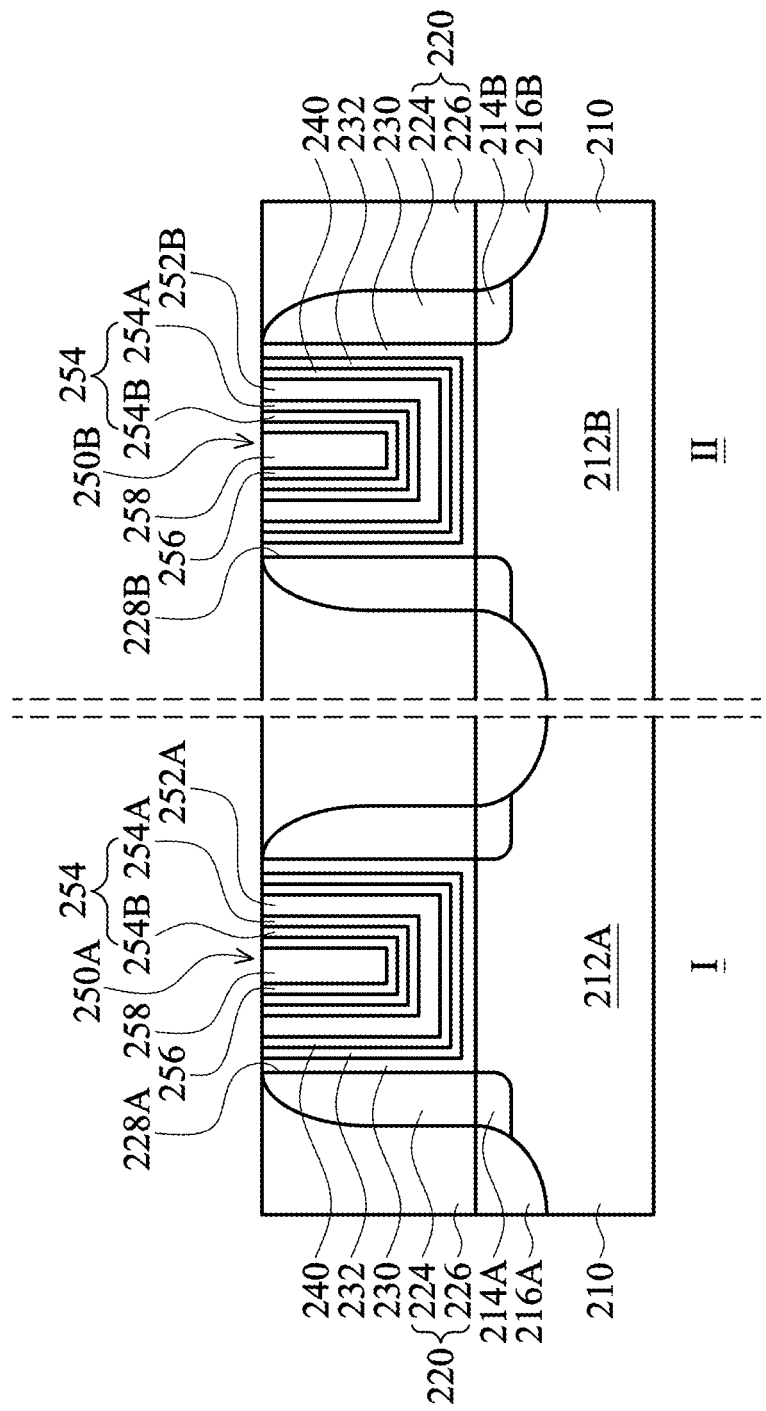

Referring to FIG. 3I, the resultant structure of FIG. 3H is planarized by using a CMP process until a top surface of the inter-layer dielectric pattern 220 is exposed in the first region I and the second region II, to form the metal filling lines 258 resulting from portions of the metal filling layer 258P within the first gate trench 228A and the second gate trench 228B, respectively.

According to one or more embodiments described with reference to FIGS. 3A through 3I, in forming the first and second metal gate electrode stacks 250A and 250B, the metal diffusion blocking layer 254, the wetting layer 256, and the metal filling line 258 are sequentially formed over the gate dielectric layer 230 within the first and second gate trenches 228A and 228B, respectively. The stack structure of the metal diffusion blocking layer 254 and the wetting layer 256 formed to cover the sidewalls 258SW and the bottom surfaces 258BT of the metal filling line 258 can inhibit diffusion of metal ions from the metal filling line 258, thereby inhibiting the formation of the undesirable voids in the first and second metal gate electrode stacks 250A and 250B.

An aspect of this description relates to a method of making a semiconductor device. The method includes forming a first dummy gate structure over a substrate, wherein the first dummy gate structure includes a first dummy electrode. The method further includes forming a second dummy gate structure over the substrate, wherein the second dummy gate structure includes a second dummy electrode. The method further includes removing the first dummy electrode to define a first opening. The method further includes removing the second dummy electrode to define a second opening, wherein the removing of the second dummy electrode occurs simultaneously with the removing of the first dummy electrode. The method further includes depositing a continuous gate dielectric layer in the first opening and the second opening, wherein the continuous gate dielectric layer comprises a single metal oxide layer. The method further includes depositing a continuous capping layer on a bottom surface and sidewalls of the continuous gate dielectric layer, wherein the continuous capping layer includes TaC and a first additional material. The method further includes depositing a continuous barrier layer on a bottom surface and sidewalls of the continuous capping layer, wherein the continuous barrier layer includes TaC and a second additional material, and the second additional material is different from the first additional material. The method further includes depositing a first work function layer over a bottom surface and sidewalls of the continuous barrier layer in the first opening. The method further includes depositing a second work function layer over a bottom surface and sidewalls of the continuous barrier layer in the second opening. The method further includes depositing a continuous metal layer over each of the first work function layer and the second work function layer. In some embodiments, the method further includes depositing a continuous metal diffusion blocking layer over a bottom surface and sidewalls of the first work function layer and over a bottom surface and sidewalls of the second work function layer. In some embodiments, the method further includes a continuous wetting layer over a bottom surface and sidewalls of the continuous metal diffusion blocking layer.

An aspect of this description relates to a method of making a semiconductor device. The method includes depositing a gate dielectric layer on a substrate, wherein the gate dielectric layer comprises a single HfO layer and a SiO$_2$ layer. The method further includes depositing a capping layer over the gate dielectric layer, wherein the capping layer directly contacts the single HfO layer, and the capping layer comprises TiN and at least one of TaC or TaN. The method further includes depositing a barrier layer over the capping layer, wherein the barrier layer comprises TaC or TiN. The method further includes depositing a work function layer over the barrier layer, wherein the work function layer comprises TiN. The method further includes depositing a metal layer over the work function layer. In some embodiments, depositing the barrier layer includes depositing the barrier layer directly on the capping layer. In some embodiments, the method further includes depositing a dielectric material over the substrate; and defining an opening in the dielectric material. In some embodiments, depositing the gate dielectric layer includes depositing the gate dielectric layer in the opening. In some embodiments, defining the opening includes removing a dummy gate. In some embodiments, the method further includes depositing a metal diffusion blocking layer over the work function layer, wherein the metal diffusion blocking layer is between the work function layer and the metal layer. In some embodiments, the method further includes depositing a wetting layer over the metal diffusion blocking layer, wherein the wetting layer is between the metal diffusion blocking layer and the metal layer. In some embodiments, the method further includes performing a planarization process on the metal layer. In some embodiments, performing the planarization process includes performing the planarization process on each of the metal layer, the work function layer, the barrier layer and the capping layer.

An aspect of this description relates to a method of making a semiconductor device. The method includes forming a first gate structure over a substrate. The method further includes forming a second gate structure over the substrate, wherein the first gate structure is spaced from the second gate structure. Forming the second gate structure includes depositing a gate dielectric layer over the substrate, wherein the gate dielectric layer comprises a single metal oxide layer. Forming the second gate structure further includes depositing a capping layer over the gate dielectric layer, wherein the capping layer comprises TiN and at least one of TaC or TaN. Forming the second gate structure further includes depositing a barrier layer over the capping layer, wherein the barrier layer comprises TaC and TiN. Forming the second gate structure further includes depositing a work function layer over the barrier layer, wherein the work function layer comprises TiN. Forming the second gate structure further includes depositing a metal layer over the work function layer. In some embodiments, forming the first gate structure includes depositing a second work function layer. In some embodiments, depositing the second work function layer includes depositing the second work function layer comprising a different material from the work function layer. In some embodiments, the method further includes implanting a first source/drain (S/D) feature in the substrate on a first side of the second gate structure; and implanting a second S/D feature in the substrate on a second side of the second gate structure. In some embodiments, the method further includes implanting a third S/D feature in the substrate on a first side of the first gate structure; and implanting a fourth S/D feature in the substrate on a second side of the first gate structure. In some embodiments, implanting the third S/D feature includes implanting a first dopant having first dopant type, implanting the first S/D feature includes implanting a second dopant having a second dopant type, and the second dopant type is opposite to the first dopant type. In some embodiments, the method further includes forming spacers over the substrate. In some embodiments, depositing the gate dielectric layer includes depositing the gate dielectric layer between the spacers.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A method of making a semiconductor device, the method comprising:
    forming a first dummy gate structure over a substrate, wherein the first dummy gate structure comprises a first dummy electrode;
    forming a second dummy gate structure over the substrate, wherein the second dummy gate structure comprises a second dummy electrode;
    removing the first dummy electrode to define a first opening;
    removing the second dummy electrode to define a second opening, wherein the removing of the second dummy electrode occurs simultaneously with the removing of the first dummy electrode;
    depositing a continuous gate dielectric layer in the first opening and the second opening, wherein the continuous gate dielectric layer comprises a single metal oxide layer;
    depositing a continuous capping layer on a bottom surface and sidewalls of the continuous gate dielectric layer, wherein the continuous capping layer comprises TiN and at least one of TaC or TaN;
    depositing a continuous barrier layer on a bottom surface and sidewalls of the continuous capping layer, wherein the continuous barrier layer comprises TaC and TiN;
    depositing a first work function layer over a bottom surface and sidewalls of the continuous barrier layer in the first opening, wherein the first work function layer comprises TiN;
    depositing a second work function layer over a bottom surface and sidewalls of the continuous barrier layer in the second opening;
    depositing a continuous metal diffusion blocking layer comprising TiN and TaN over a bottom surface and sidewalls of the first work function layer, and over a bottom surface and sidewalls of the second work function layer; and
    depositing a continuous metal layer over each of the first work function layer and the second work function layer.

2. The method of claim 1, wherein depositing the continuous metal layer comprises depositing at least one of aluminum, copper or tungsten.

3. The method of claim 1, further comprising depositing a continuous wetting layer over a bottom surface and sidewalls of the continuous metal diffusion blocking layer.

4. A method of making a semiconductor device, the method comprising:
    depositing a gate dielectric layer on a substrate, wherein the gate dielectric layer comprises a single HfO layer and a SiO$_2$ layer;
    depositing a capping layer over the gate dielectric layer, wherein the capping layer directly contacts the single HfO layer, and the capping layer comprises TiN and at least one of TaC or TaN;
    depositing a barrier layer over sidewalls of the capping layer, wherein the barrier layer comprises TaC and TiN;
    depositing a work function layer over the barrier layer, wherein the work function layer comprises TiN;
    depositing a metal diffusion blocking layer in contact with the work function layer, wherein depositing the metal diffusion blocking layer comprises:
        depositing a first metal diffusion blocking sub-layer comprising TiN; and
        depositing a second metal diffusion blocking sub-layer comprising TaN; and
    depositing a metal layer over the metal diffusion blocking layer.

5. The method of claim 4, wherein depositing the barrier layer comprises depositing the barrier layer directly on the capping layer.

6. The method of claim 4, further comprising:
    depositing a dielectric material over the substrate; and
    defining an opening in the dielectric material.

7. The method of claim 6, wherein depositing the gate dielectric layer comprises depositing the gate dielectric layer in the opening.

8. The method of claim 6, wherein defining the opening comprises removing a dummy gate.

9. The method of claim 4, wherein depositing the metal layer comprises
    depositing at least one of aluminum, copper, or tungsten.

10. The method of claim 4, further comprising depositing a wetting layer over the metal diffusion blocking layer, wherein the wetting layer is between the metal diffusion blocking layer and the metal layer.

11. The method of claim 4, further comprising performing a planarization process on the metal layer.

12. The method of claim 11, wherein performing the planarization process comprises performing the planarization process on each of the metal layer, the work function layer, the barrier layer and the capping layer.

13. A method of making a semiconductor device, the method comprising:
    forming a first gate structure over a substrate; and
    forming a second gate structure over the substrate, wherein the first gate structure is spaced from the second gate structure, and forming the second gate structure comprises:
        depositing a gate dielectric layer over the substrate, wherein the gate dielectric layer comprises a single metal oxide layer;
        depositing a capping layer directly contacting sidewalls of the gate dielectric layer, wherein the capping layer comprises TiN and at least one of TaC or TaN;
        depositing a barrier layer directly contacting the capping layer, wherein the barrier layer comprises TaC and TiN;
        depositing a work function layer over the barrier layer, wherein the work function layer comprises TiN;
        depositing a metal diffusion blocking layer in contact with the work function layer, wherein the metal diffusion blocking layer comprises a TiN layer; and
        depositing a metal layer over the metal diffusion blocking layer.

14. The method of claim 13, wherein forming the first gate structure comprises depositing a second work function layer.

15. The method of claim 14, wherein depositing the second work function layer comprises depositing the second work function layer comprising a different material from the work function layer.

16. The method of claim 13, further comprising:
    implanting a first source/drain (S/D) feature in the substrate on a first side of the second gate structure; and
    implanting a second S/D feature in the substrate on a second side of the second gate structure.

17. The method of claim 16, further comprising:
    implanting a third S/D feature in the substrate on a first side of the first gate structure; and
    implanting a fourth S/D feature in the substrate on a second side of the first gate structure.

18. The method of claim 17, wherein implanting the third S/D feature comprises implanting a first dopant having a first dopant type, implanting the first S/D feature comprises implanting a second dopant having a second dopant type, and the second dopant type is opposite to the first dopant type.

19. The method of claim 13, further comprising forming spacers over the substrate.

20. The method of claim 19, wherein depositing the gate dielectric layer comprises depositing the gate dielectric layer between the spacers.

* * * * *